US012781381B2

(12) United States Patent
Sagan et al.

(10) Patent No.: US 12,781,381 B2
(45) Date of Patent: Nov. 3, 2026

(54) INDUCTION MELTING OF SILICON USING TANTALUM AS A HEAT-DELIVERY SEED

(71) Applicant: Blue Origin Manufacturing, LLC, Huntsville, AL (US)

(72) Inventors: Lauren Thomas Sagan, Los Angeles, CA (US); Vernon G. Harris, II, Los Angeles, CA (US); Patrick Michael McGarey, South Pasadena, CA (US); Albert Ridilla, Kent, WA (US); Alexander ImBault, Sierra Madre, CA (US); Eric D. Contreras, San Dimas, CA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 218 days.

(21) Appl. No.: 18/437,285

(22) Filed: Feb. 9, 2024

(65) Prior Publication Data

US 2025/0257494 A1 Aug. 14, 2025

(51) Int. Cl.
*C30B 15/14* (2006.01)
*C30B 15/20* (2006.01)
*C30B 29/06* (2006.01)

(52) U.S. Cl.
CPC .............. *C30B 15/14* (2013.01); *C30B 15/20* (2013.01); *C30B 29/06* (2013.01)

(58) Field of Classification Search
CPC .......... C30B 15/20; C30B 15/14; C30B 29/06
See application file for complete search history.

(56) References Cited

U.S. PATENT DOCUMENTS 3,156,549 A 11/1964 Kelemen
3,573,967 A * 4/1971 Pfann et al. ............ C30B 11/12 117/936
6,251,182 B1 6/2001 Luna et al.
6,454,994 B1 * 9/2002 Wang .................... B25B 15/008 148/422
6,540,851 B2 4/2003 Huber, Jr. et al.
8,884,199 B2 11/2014 Nadot et al.
8,992,872 B2 3/2015 Fishman
12,612,690 B1 4/2026 Ignatiev
2010/0051609 A1 3/2010 Fishman
(Continued)

OTHER PUBLICATIONS

Blue Alchemist Technology Powers our Lunar Future, Blue Origin, Blog accessed at https://www.blueorigin.com/news/blue-alchemist-powers-our-lunar-future/, Feb. 10, 2023.
(Continued)

*Primary Examiner* — Robert M Kunemund
(74) *Attorney, Agent, or Firm* — Summit Patents, PC

(57) ABSTRACT

Methods and configurations for melting silicon by induction using tantalum as a heat-delivery seed are presented. The tantalum supports induction-generated electrical eddy currents and resultantly heats to relatively high temperatures. The heat of the tantalum then conducts into surrounding silicon, which melts. Because the tantalum does not melt at the relatively low melting temperature of silicon, the tantalum will not contaminate the molten silicon, which may thus have a high purity. The melted silicon may then be used in processes that form thin films on a substrate or ingots.

20 Claims, 4 Drawing Sheets

(56) References Cited

U.S. PATENT DOCUMENTS

| | | | | |
|---|---|---|---|---|
| 2010/0148403 | A1* | 6/2010 | Stoddard | C30B 28/06 264/431 |
| 2019/0322533 | A1 | 10/2019 | Yang et al. | |

OTHER PUBLICATIONS

Hans Windsheimer, Roland Waitz, and Peter Wubben, "Inductive melting in cold wall crucible: technology and applications." Heat Processing (2015) 5 pages.

Filippo Maglia, Chiara Milanese, Umberto Anselmi-Tamburini, Stefania Doppiu, Giorgio Cocco, Zuhair A. Munir, "Combustion synthesis of mechanically activated powders in the Ta-Si system." Journal of Alloys and Compounds, vol. 385 (2004) pp. 269-275.

Joshua Pelleg, Shmuel Rosenberg, and Misha Sinder, "Silicide Film Formation in the Ta/Ti/Si System by RF Induction Heating. " MRS Proceedings. 2009.

Bo Yun Jang, Joon Soo Kim, Young Soo Ahn, "Induction melting process using segmented graphite crucible for silicon melting." Solar Energy Materials and Solar Cells, vol. 95 (2011) pp. 101-106.

* cited by examiner

INDUCTION MELTING OF SILICON USING TANTALUM AS A HEAT-DELIVERY SEED

BACKGROUND

Silicon is well-known for a wide variety of products and applications. For example, silicon serves as the basis for most integrated circuits (ICs). Nearly every electronic device today contains silicon ICs. In some particular examples, silicon is used to make transistors, solar cells, light-emitting diodes (LEDs), and other semiconductor devices including power electronics. Apart from electronics applications, silicon carbide is used as an abrasive in the manufacturing of ultrahard materials. In still another type of application, silicon is alloyed with metals to make high-performance alloys for use in high-temperature environments or to reduce the metal's weight.

A large part of utilizing silicon in these various applications is the initial process of melting the silicon as a segway to its incorporation into products or to its highly pure form. For example, highly pure silicon is desired or required for IC fabrication and solar cell cover glass.

The melting of silicon may be thought to be a relatively simple operation, but in fact, there may be a number of difficulties. For example, silicon may be melted in a crucible by resistive radiant heating elements. This heating method, however, may have a relatively low heating/melting rate. For small batch production, silicon may be melted in a process of electron beam deposition. This melting process, however, is very power intensive and is generally only useful for producing thin films of silicon. Silicon may be melted in induction furnaces, but this method of melting has generally been known to introduce undesirable contamination from seed materials, such as graphite, used in the induction melting. Accordingly, there continues to be a desire for a silicon melting process that avoids using excessive amounts of energy and leads to highly pure silicon.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
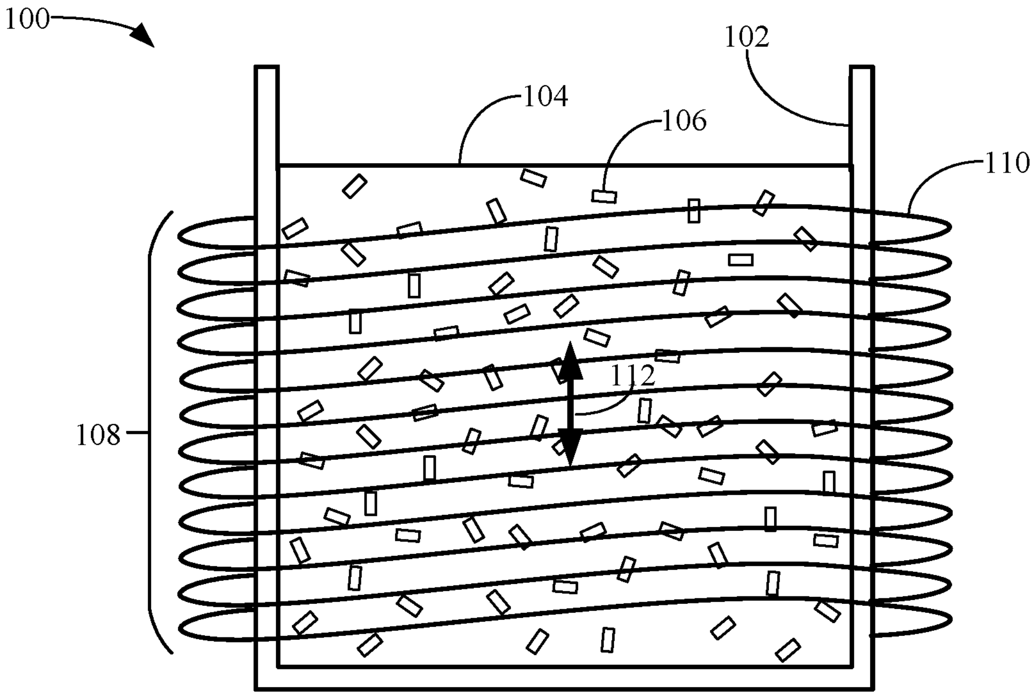
FIG. 1 is a schematic side view of a system for induction melting of silicon, according to some embodiments.

This disclosure describes methods and configurations for melting silicon by induction using tantalum as a seed for heat delivery to the silicon. In this context, such a heat-delivery seed supports induction-generated electrical eddy currents and resultantly heats to relatively high temperatures. The heat of the heat-delivery seed then conducts into surrounding silicon, which melts. For reasons explained below, tantalum is the heat-delivery seed used in embodiments described herein.

Metals and metalloids derived from lunar regolith or other impure feedstocks may lead to materials with impurities. Generally, materials such as silicon need to be purified before being utilized. For example, silicon for solar cells should be greater than 99.999% pure. Silicon ingot fabrication may be a precursor to fabricating solar cells, which may be used to provide electricity on the Moon. Thus, a process of fabricating silicon ingots may involve steps to achieve high purity silicon. Melting silicon in a particular way may be among these steps. For example, purification may be achieved by melting silicon using solid tantalum that is intermixed with the silicon. As mentioned above, tantalum is a heat-delivery seed that can be heated by induction. Other heat-delivery seeds such as graphite may be used for induction heating but these materials may likely contaminate the silicon melt. In contrast, using tantalum as a heat-delivery seed may allow for melting silicon while the silicon maintains a relatively high purity. For example, the tantalum remains solid in the liquid silicon and thus can be strained out of the melt. Other heat-delivery seeds may melt with the silicon, contaminating the silicon and necessitating additional purification steps.

In some embodiments, a method for melting silicon may include forming a mixture of solid silicon and solid tantalum and placing the mixture into a vessel (e.g., a container). The mixture may then be subjected to a time-varying magnetic field to heat the solid tantalum via induction. The heated solid tantalum may then transfer its heat to the solid silicon surrounding and/or in contact with the tantalum. After a sufficient amount of heat has transferred to the silicon the solid silicon will melt. The melted silicon may then be processed in any number of ways to produce silicon products, such as silicon ingots or thin films, as described below. Meanwhile, the tantalum, which remains solid throughout the process of melting the silicon, can be strained out of the container or, having sunk in the liquid silicon, may be left on or near the bottom of the container. In various implementations, the solid tantalum may be cylindrical, spherical, conical, or substantially random-shaped. Rate of tantalum sinking may be at least partially dependent on its shape. The mixture may be substantially uniform such that the solid tantalum and the solid silicon are homogeneously mixed. In another implementation, the mixture may be non-uniform such that a density distribution or concentration of the solid tantalum varies vertically in the container.

In some implementations, the method may further include adjusting a spatial distribution of the time-varying magnetic field based, at least in part, on a rate of sinking of the solid tantalum in the liquid silicon. The spatial distribution may be based, at least in part, on a position or orientation of one or more solenoids that produce that magnetic field. For example, the time-varying magnetic field may be applied mostly in an upper portion of the container while the silicon is still solid and tantalum has not begun to sink. After the silicon melts, the tantalum will begin to sink and the time-varying magnetic field may resultantly be mostly applied to a lower portion of the container.

In some implementations, the method may further include adjusting the magnitude of the time-varying magnetic field based, at least in part, on a rate of sinking of the solid tantalum in the liquid silicon. The magnitude of the time-varying magnetic field may be based, at least in part, on a direction and amount of electrical current in one or more solenoids that produce that magnetic field. For example, the applied time-varying magnetic field may be relatively strong while the silicon is still solid and tantalum has not begun to sink. After the silicon melts, the tantalum will begin to sink and the strength of the time-varying magnetic field may be resultantly reduced. The rate of sinking of the solid tantalum in the liquid silicon may be measured in real-time or known empirically by previous operations or experiment, for example.

In some implementations, the time-varying magnetic field may be produced by a vertically-moveable solenoid and controlling the vertical motion of the solenoid may be based on a rate of sinking of the solid tantalum in the liquid silicon. In some implementations, the time-varying magnetic field may be produced by a vertically-moveable solenoid and controlling the vertical motion of the solenoid may be based on a rate of melting of the solid silicon. In some implementations, the time-varying magnetic field may be produced by a solenoid that comprises two or more individually operable portions. In such implementations, the method for melting silicon may further include selectively operating the two or more individually operable portions of the solenoid based on a rate of sinking of the solid tantalum in the liquid silicon. In some implementations, the time-varying magnetic field may be produced by a solenoid that comprises two or more individually operable portions. In such implementations, the method for melting silicon may further include selectively operating the two or more individually operable portions of the solenoid based on a rate of melting of the solid silicon.

As mentioned above, after the silicon has melted and after the solid tantalum has sunk toward the bottom of the container or removed by straining, for example, silicon vapor from the liquid silicon may be allowed to condense onto a surface (e.g., substrate) that is above the container, thus forming a thin film of silicon. In another post-melting process, after the solid tantalum has sunk toward the bottom of the container or has been removed by straining, for example, a seed crystal may be placed into the liquid silicon and a silicon crystal may be allowed to grow from the seed crystal.

In some embodiments, a system for performing a method the same as or similar to the method described above may include a refractory crucible (e.g., vessel), a mixture of solid silicon and solid tantalum in the refractory crucible, and an induction coil (e.g., solenoid) to produce a time-varying magnetic field in the mixture to heat the solid tantalum. The heated solid tantalum may conduct heat to the solid silicon to melt the solid silicon into liquid silicon. As mentioned above, the solid tantalum may be cylindrical, spherical, conical, or other shape. In some implementations, the mixture may be substantially uniform such that the solid tantalum and the solid silicon are homogeneously mixed. In other implementations, the mixture may be non-uniform such that a density distribution or concentration of the solid tantalum varies vertically in the container. The system may also include a controller to adjust a distribution of the time-varying magnetic field based on a rate of sinking of the solid tantalum in the liquid silicon. The controller may also be configured to adjust the intensity or strength of the time-varying magnetic field based on a rate of sinking of the solid tantalum in the liquid silicon. In some implementations, the induction coil may be vertically moveable and the controller may be configured to vertically move the solenoid based on a rate of sinking of the solid tantalum in the liquid silicon. In some implementations the induction coil may comprise two or more individually operable portions and the controller may be configured to selectively operate the two or more individually operable portions of the solenoid based on a rate of melting of the solid silicon.

FIG. 1 is a schematic side view of a system 100 for induction melting of silicon, according to some embodiments. Various portions of the system, as illustrated, are not necessarily to scale. System 100 generally comprises electrical and mechanical components that are interfaced with one another in various configurations. System 100 may further comprise one or more computer processors configured to execute computer-readable instructions, which may be directed to controlling at least some of the electrical and mechanical components, for example.

System 100 includes a vessel 102, which may be a crucible or other container comprising refractory materials to withstand the relatively high temperatures of melted metals or metalloids. Vessel 102 may contain a mixture of silicon 104 and tantalum 106, as described in detail below. A solenoid 108 may surround substantially the full height of vessel 102, or at least a portion of the expected height of the tantalum-silicon mixture therein. Solenoid 108 may comprise multiple windings of an electrical conductor (e.g., wire) 110. The windings completely wrap around vessel 102. Electrical current flowing in conductor 110 may give rise to a magnetic field 112 having a direction that depends on the direction of instantaneous electrical current flow in the conductor. Moreover, if the magnitude and direction of the electrical current vary over time, so will the magnetic field. Such a varying direction of the magnetic field may give rise to eddy currents in tantalum 106. Concomitant with the resistivity of the tantalum, the eddy currents may raise the temperature of the tantalum above the melting temperature of the surrounding silicon. This is an embodiment of induction heating. For example, the heating profile is related to the eddy currents created in the tantalum. Due to heat conduction from tantalum 106 to silicon 104, the silicon may melt while the tantalum, having a substantially higher melting temperature, remains solid.

As mentioned above, solenoid 108 of system 100 may be a single coil that extends substantially from the bottom to the top of vessel 102. This is in contrast to other embodiments, as described below.

Figure 2:
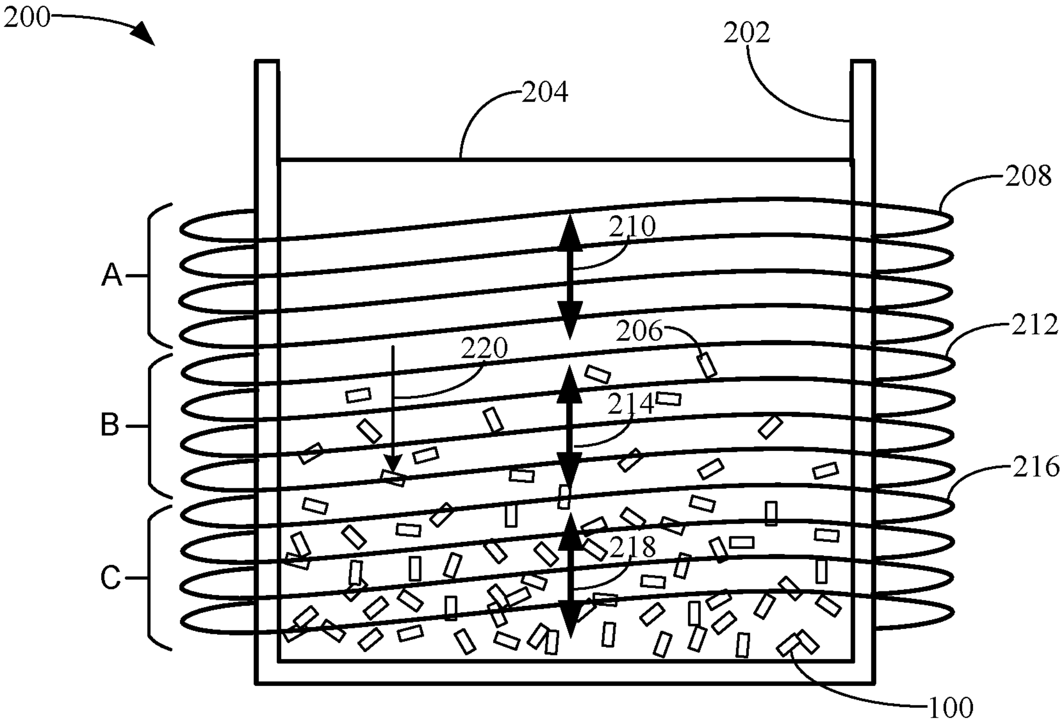
FIG. 2 is a schematic side view of a system for induction melting of silicon, according to other embodiments.

FIG. 2 is a schematic side view of a system 200 for induction melting of silicon, according to some embodiments. Various portions of the system, as illustrated, are not necessarily to scale. System 200 generally comprises electrical and mechanical components that are interfaced with one another in various configurations. System 200 may further comprise one or more computer processors configured to execute computer-readable instructions, which may be directed to controlling at least some of the electrical and mechanical components. For example, timing, direction, and intensity of electrical current in various solenoids of the system may be operated autonomously by a computer processor and/or human operator control. In some implementations, such control may be based, at least partially, on parameters (e.g., temperature, viscosity, image details, fill levels, etc.) measured by various types of detectors that are placed in appropriate places in the system.

System 200 includes a vessel 202, which may be a crucible or other container comprising refractory materials to withstand the relatively high temperatures of melted metals or metalloids. Vessel 202 may contain a mixture of silicon 204 and tantalum 206, as described in detail below. In contrast to a full solenoid (e.g., 108) that may extend the full length of the vessel, vessel 202 may be encircled by two or more solenoids that may be operated independently of one another. In particular, system 200 includes three solenoids A, B, and C. Solenoid A comprises conductor loops 208 that, when carrying an electrical current, generate a magnetic field 210. Solenoid B comprises conductor loops 212 that, when carrying an electrical current, generate a magnetic field 214. Solenoid C comprises conductor loops 216 that, when carrying an electrical current, generate a magnetic field 218. It is important to note that arrows for 210, 214, and 218 are each merely representative of a magnetic field that encompasses the volume within (and beyond) the respective solenoids. In other words, the magnetic field is not just in the region of the arrows. For example, magnetic field lines (e.g., flux) are closed such that each field line wraps around the electrical current source (e.g., solenoid) that produces the magnetic field. Accordingly, tantalum 206 that is in a volume within a solenoid will experience the magnetic field generated by the solenoid. If the electrical current carried by the solenoid is time-varying, then eddy currents may arise in the tantalum, which may resultantly heat up to melt surrounding silicon within, and slightly beyond, the solenoid.

In some implementations, as the solenoids are operated to heat tantalum 206 and to resultantly melt silicon 204, the solenoids may be turned off sequentially in a direction that follows the tantalum as it sinks through the liquid silicon. In this way, a spatial distribution of the time-varying magnetic field in vessel 202 produced by the solenoids may be adjusted based on a rate of sinking of the solid tantalum in the liquid silicon. For example, in beginning stages of a process to melt silicon 204, tantalum 206 may be substantially uniformly mixed with the silicon. All three solenoids A, B, C may be operated to generate time-varying magnetic fields 210, 214, and 218, respectively. As the time-varying magnetic fields heat tantalum 206 by creating eddy currents in the tantalum, this heat will conduct into silicon 204, which begins to melt. As the silicon melts to a liquid, the tantalum will begin to sink due to gravity, as indicated by arrow 220. After some period of time, the tantalum within solenoid A will sink below the region within solenoid A and into the regions within solenoids B and C. For example, FIG. 2 schematically illustrates substantially no tantalum within solenoid A, a concentration of tantalum within solenoid B, and a relatively high concentration of tantalum within solenoid C. When this occurs, solenoid A may be turned off while solenoids B and C continue to operate. After an additional period of time, the tantalum within solenoid B will sink below the region within solenoid B and into the region within solenoid C. When this occurs, solenoid B may be turned off while solenoid C continues to operate. By the time that all the tantalum sinks to the bottom of vessel 202, all the silicon has melted.

As mentioned above, solid tantalum 206 (or 106) is mixed with solid silicon (e.g., 104 or 204). The solid silicon may be a powder or mixture having uniform or non-uniform grain sizes, which may range from a fraction of a millimeter to centimeters, for example. The tantalum may have a similar size range. The tantalum may also be shaped in a particular way, if not randomly shaped. For example, the shape of tantalum 206 may be cylindrical, spherical, cubical, or conical. The shape of tantalum may determine its rate of sinking in liquid silicon. Generally, all other variables being equal, the more streamlined an object is, the faster it will fall through a liquid. Though it is more than double the density of water, liquid silicon has a viscosity that is similar to water. The density of tantalum is more than six times greater than that of liquid silicon. Thus, tantalum will readily sink through liquid silicon, with a rate of sinking at least partially based on the shape of the tantalum. Among some different shapes, cone-shaped tantalum may sink the fastest, cylindrically-shaped tantalum may sink the slowest, and the cubical or spherical shapes may sink at rates somewhere in-between. In some implementations, tantalum 206 may be cylindrically shaped because relatively slow sinking may be beneficial for melting the surrounding silicon in upper portions of vessel 202, for example.

In addition to sizes and shapes of tantalum 206 and silicon 204, the distribution of the tantalum in the mix with silicon may be considered for the process of melting the silicon. For example, in one implementation, the tantalum may be mixed homogeneously with the silicon throughout the mixture. The concentration of the tantalum in the mixture, such as percentage by weight or volume, may be determined based on various parameters of vessel 202 and solenoids A, B, and C, such as vessel and solenoid sizes, magnetic field strength, desired timing of the melting operation, grain size(s) of the silicon, and size/shape(s) of the tantalum, just to name a few examples. In another implementation, the tantalum may be mixed non-homogeneously with the silicon throughout the mixture. For example, the tantalum concentration may be greater toward the top of vessel 202 and linearly or non-linearly decrease toward the bottom of the vessel. In other examples, the maximum concentration may be elsewhere in the vessel. Such non-homogeneous mixes in vessel 202 may be achieved by adjusting the rate of flow of tantalum, relative to the rate of flow of the silicon, into the vessel as the level of the mixture rises in the vessel.

Thus, as explained above, shapes of the tantalum and how the tantalum is mixed with the silicon may be considered for operating magnetic field-inducing solenoids such as solenoids A, B, and C. Claimed subject matter is not limited to any particular type of mixture.

Figure 3:
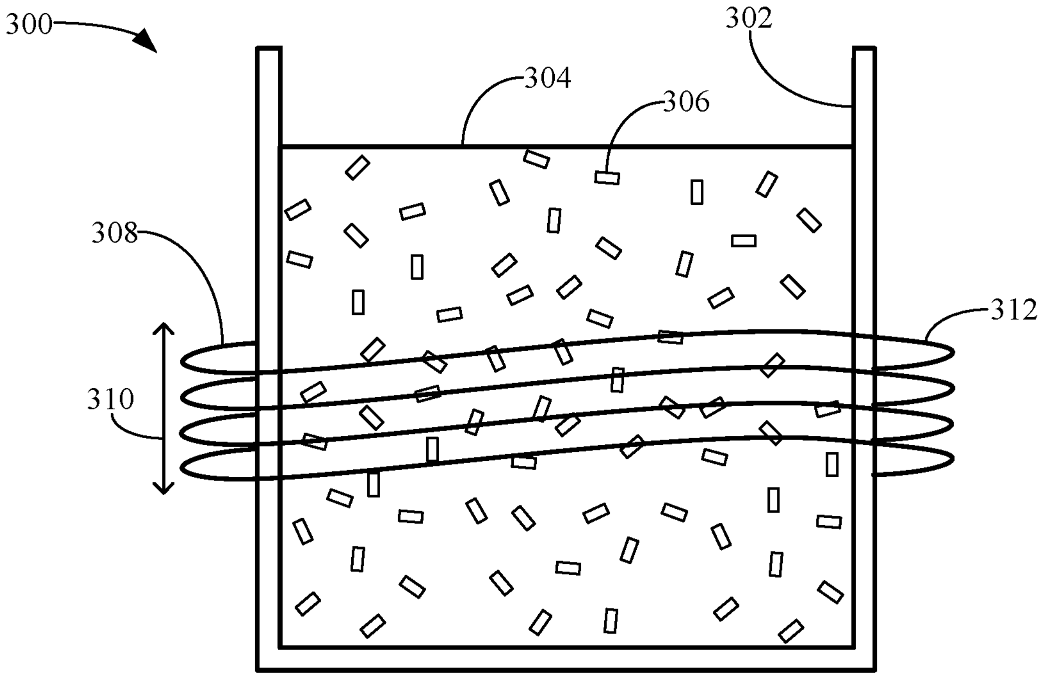
FIG. 3 is a schematic side view of a system for induction melting of silicon, according to still other embodiments.

FIG. 3 is a schematic side view of a system 300 for induction melting of silicon, according to some embodiments. Various portions of the system, as illustrated, are not necessarily to scale. System 300 generally comprises electrical and mechanical components that are interfaced with one another in various configurations. System 300 may further comprise one or more computer processors configured to execute computer-readable instructions, which may be directed to controlling at least some of the electrical and mechanical components. For example, timing, direction, and intensity of electrical current and vertical positioning of one or more solenoids of the system may be operated autonomously by a computer processor and/or human operator control. In some implementations, such control may be based, at least partially, on parameters (e.g., temperature, viscosity, image details, fill levels, etc.) measured by various types of detectors in the system.

System 300 includes a vessel 302, which may be a crucible or other container comprising refractory materials to withstand the relatively high temperatures of melted metals or metalloids. Vessel 302 may contain a mixture of silicon 304 and tantalum 306, as described above for example. In contrast to a full solenoid (e.g., 108) that extends the full length of the vessel, vessel 302 may be encircled by a solenoid 308 that extends along only a portion of the height of vessel 302. Solenoid 308 may be configured to move up and down vertically along the height of vessel 302, as indicated by arrow 310. Solenoid 308 comprises conductor loops 312 that, when carrying an electrical current, generate a magnetic field in the portion of vessel 302 that is substantially within the solenoid. As explained above, the magnetic field extends beyond this region but with a lesser strength. Accordingly, tantalum 306 that is in a volume within solenoid 308 will experience the magnetic field generated by the solenoid. If the direction of the electrical current carried by the solenoid is time-varying, then eddy currents may arise in the tantalum, which may resultantly heat up to melt surrounding silicon within, and slightly beyond, the solenoid.

In some implementations, solenoid 308 is periodically or from time to time moved up and down along the height of vessel 302. The solenoid may be moved up and down to provide a time-varying magnetic field to all portions of the vessel equally (at different times) or to provide a time-varying magnetic field to different portions of the vessel differently. For example, solenoid 308 may be moved vertically in such a way as to spend relatively more time toward the bottom of vessel 302 as compared to the top of the vessel. In some implementations, solenoid 308 may be moved vertically at a rate based on a rate of melting of the silicon or a rate of sinking of the tantalum through melted silicon. In this way, a spatial distribution of the time-varying magnetic field in vessel 302 produced by the solenoid may be adjusted based on a rate of sinking of the solid tantalum in the liquid silicon or the rate of melting of the silicon.

Figure 4:
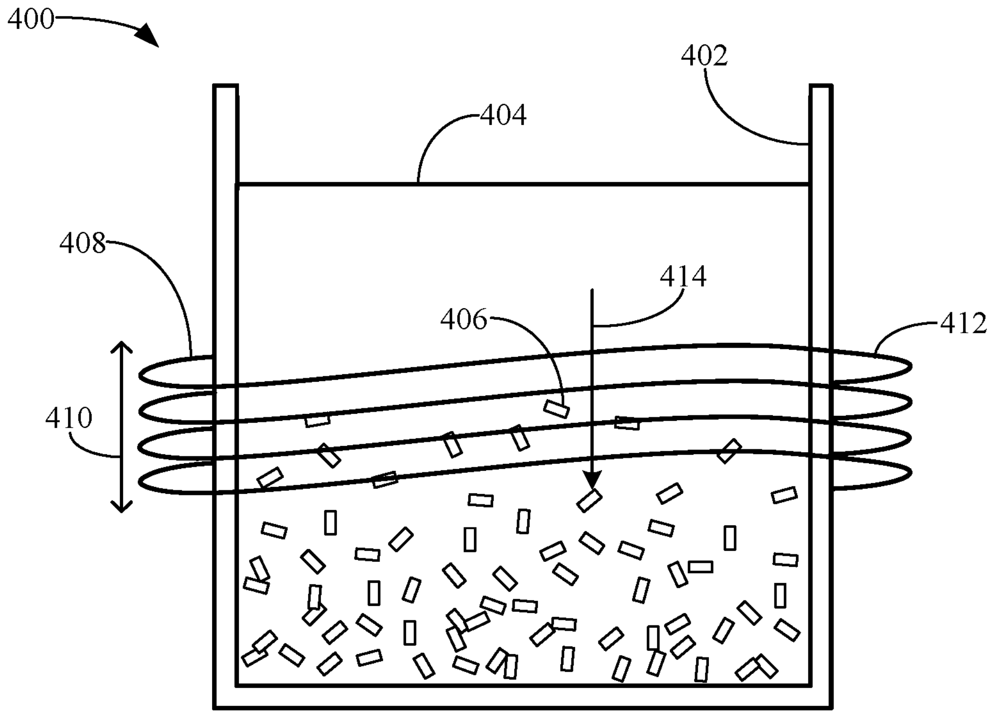
FIG. 4 is a schematic side view of a system for induction melting during a process of melting of silicon with solid tantalum, according to some embodiments.

FIG. 4 is a schematic side view of a system 400 for induction melting during a process of melting silicon with solid tantalum, according to some embodiments. Various portions of the system, as illustrated, are not necessarily to scale. System 400 generally comprises electrical and mechanical components that are interfaced with one another in various configurations. System 400 may further comprise one or more computer processors configured to execute computer-readable instructions, which may be directed to controlling at least some of the electrical and mechanical components. For example, timing, direction, and intensity of electrical current and vertical positioning of one or more solenoids of the system may be operated autonomously by a computer processor and/or human operator control. In some implementations, such control may be based, at least partially, on parameters (e.g., temperature, viscosity, image details, fill levels, etc.) measured by various types of detectors in the system.

System 400 includes a vessel 402, which may be a crucible or other container comprising refractory materials to withstand the relatively high temperatures of melted metals or metalloids. Vessel 402 may contain a mixture of silicon 404 and tantalum 406, as described above for example. In contrast to a full solenoid (e.g., 108) that extends the full length of the vessel, vessel 402 may be encircled by a solenoid 408 that extends along only a portion of the height of vessel 402. Solenoid 408 may be configured to move up and down vertically along the height of vessel 402, as indicated by arrow 410. Solenoid 408 comprises conductor loops 412 that, when carrying an electrical current, generate a magnetic field in the portion of vessel 402 that is substantially within the solenoid. As explained above, the magnetic field extends beyond this region but with a lesser strength. Accordingly, tantalum 406 that is in a volume within solenoid 408 will experience the magnetic field generated by the solenoid. If the direction of the electrical current carried by the solenoid is time-varying, then eddy currents may arise in the tantalum, which may resultantly heat up to melt surrounding silicon within, and slightly beyond, the solenoid.

In some implementations, as solenoid 408 is operated to heat tantalum 406 and to resultantly melt silicon 404, the solenoid may be lowered in a direction that follows the tantalum as it sinks through the liquid silicon. In this way, a spatial distribution of the time-varying magnetic field in vessel 402 produced by the solenoid may be adjusted based on a rate of sinking of the solid tantalum in the liquid silicon. For example, in beginning stages of a process to melt silicon 404, tantalum 406 may be substantially uniformly mixed with the silicon. Solenoid 408 may be operated to generate a time-varying magnetic field mostly in the upper portion of the tantalum/silicon mixture. As the time-varying magnetic field heats tantalum 406 by creating eddy currents in the tantalum, this heat will conduct into silicon 404, which begins to melt. As the silicon melts to a liquid, the tantalum will begin to sink due to gravity, as indicated by arrow 414. As this sinking occurs, solenoid 408 may be lowered at a rate based on a rate of the sinking. By the time that all the tantalum sinks to the bottom of vessel 402, all the silicon has melted.

Figure 5:
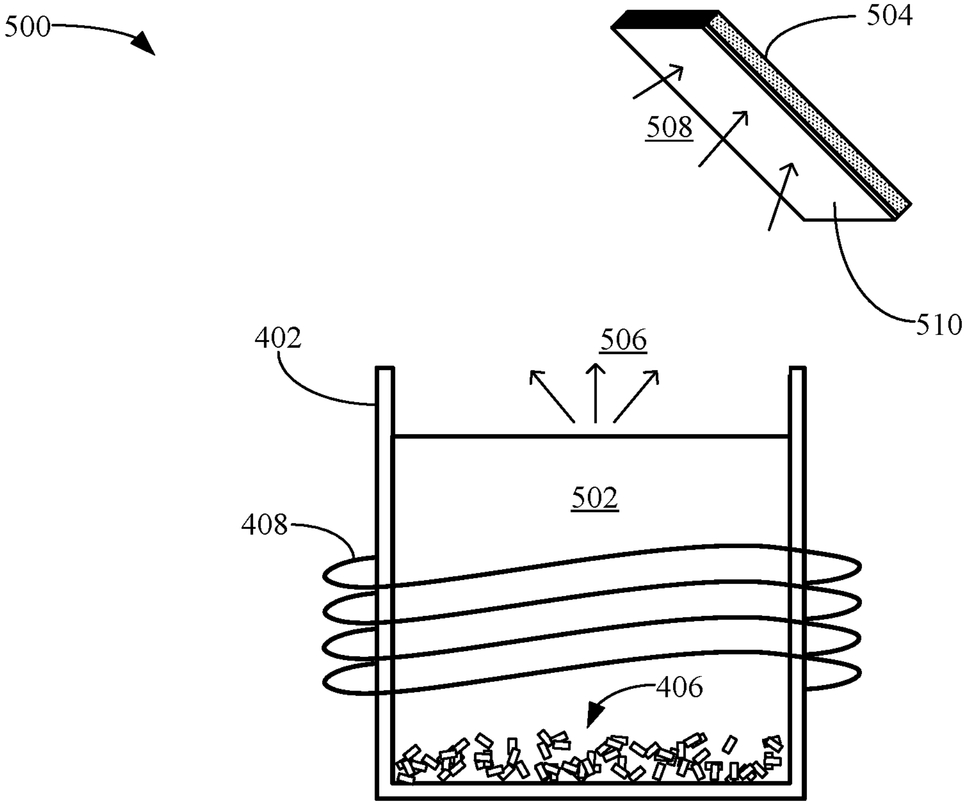
FIG. 5 is a schematic side view of a system for induction melting of silicon and subsequent evaporative deposition, according to some embodiments.

FIG. 5 is a schematic side view of a system 500 for induction melting of silicon and subsequent evaporative deposition, according to some embodiments. Various portions of the system, as illustrated, are not necessarily to scale. System 500 generally comprises electrical and mechanical components that are interfaced with one another in various configurations. System 500 may further comprise one or more computer processors configured to execute computer-readable instructions, which may be directed to controlling at least some of the electrical and mechanical components. For example, timing, direction, and intensity of electrical current and vertical positioning of one or more solenoids of the system may be operated autonomously by a computer processor and/or human operator control. In some implementations, such control may be based, at least partially, on parameters (e.g., temperature, viscosity, image details, fill levels, etc.) measured by various types of detectors in the system.

System 500 comprises a configuration that includes a mass of molten silicon 502 that was melted in a system the same as or similar to 100, 200, 300, or 400, for example. In particular, FIG. 5 illustrates system 400 after a time period that was sufficient for solenoid 408 to melt all of silicon 404, resulting in all of tantalum 406 sinking to the bottom of vessel 402 that contains molten silicon 502 thereabove. A substrate 504 may be positioned above and relatively near to vessel 402 that is open at its top. The liquid phase (502) of silicon 404 allows for its evaporation, indicated by arrows 506. Subsequent condensation, indicated by arrows 508 may occur as a thin film 510 onto substrate 504, according to some embodiments. For example, thin film 510 may form on substrate 504 that is relatively cold to allow for condensation of the ambient vapor from molten silicon 502. In some implementations, an environment such as the Moon may be used to maintain the cold substrate temperatures. Herein, a substrate being relatively cold means that the substrate is substantially colder than an ambient vaporized material. One substrate is illustrated for clarity, but multiple substrates may be included in the configuration of system 500 to capture vaporized material.

As explained above, the tantalum remains solid throughout the silicon melting process. Thus, the tantalum will not contaminate molten silicon 502 and therefore the molten silicon may have a relatively high purity. To add to this, evaporative deposition further contributes to high purity. Thus, silicon thin film 510 may have an even higher purity. For example, any impurity in molten silicon 502 may be excluded (e.g., left behind) from vaporization of the silicon. Thus, a condensed thin film (e.g., 510) will not include the impurity.

The orientation of substrate 504 and other parts of system 500 (e.g., the vessel and solenoid) are merely examples and claimed subject matter is not so limited. Though an example of a process performed by system 500 is described herein as being performed on the Moon, such processes of system 500 may also be performed on Earth and claimed subject matter is not limited in this respect.

Figure 6:
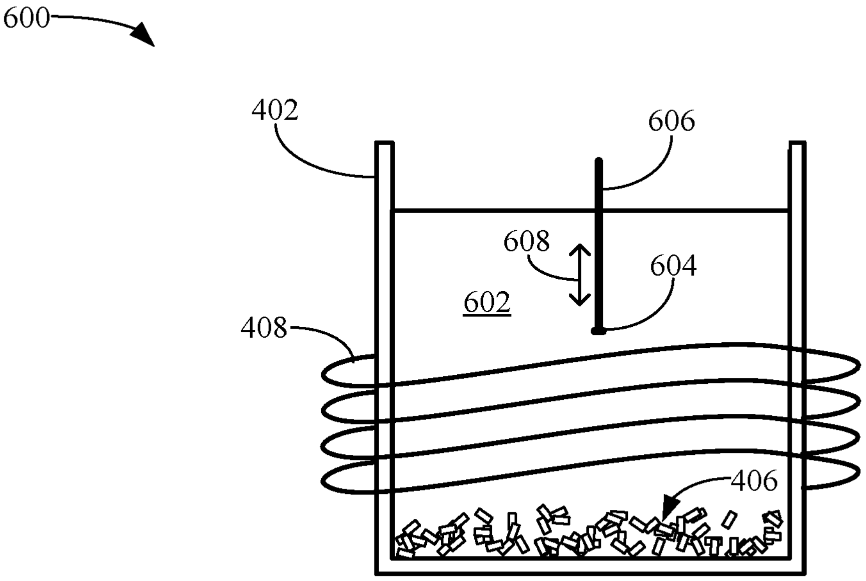
FIG. 6 is a schematic side view of a system for induction melting of silicon and subsequent silicon crystal formation, according to some embodiments.

FIG. 6 is a schematic side view of a system 600 for induction melting of silicon and subsequent silicon crystal formation, according to some embodiments. Various portions of the system, as illustrated, are not necessarily to scale. System 600 generally comprises electrical and mechanical components that are interfaced with one another in various configurations. System 600 may further comprise one or more computer processors configured to execute computer-readable instructions, which may be directed to controlling at least some of the electrical and mechanical components. For example, timing, direction, and intensity of electrical current and vertical positioning of one or more solenoids of the system may be operated autonomously by a computer processor and/or human operator control. In some implementations, such control may be based, at least partially, on parameters (e.g., temperature, viscosity, image details, fill levels, etc.) measured by various types of detectors in the system.

Silicon ingot fabrication may generally be a precursor to fabrication of solar cells, which may, for example, be used to provide electricity on the moon. Silicon ingot formation processes may face challenges to controlling grain structure, defect density, and impurities that will ultimately affect its material properties. For example, the final grain structure and inherent structural defects often associated with impurity distribution in the ingot from its manufacturing are generally responsible for photovoltaic properties of a solar cell. Impurities may play a major role as they not only can modify the development of the grain structure formation but can also interact with structural defects to create regions of deleterious minority carrier lifetime recombination in solar cells, for example. System 600 may be configured to produce high-purity silicon ingots via the Czochralski method of crystal growth, as described below.

System 600 comprises a configuration that includes a mass of molten silicon 602 that was melted in a system the same as or similar to 100, 200, 300, or 400, for example. In particular, FIG. 6 illustrates system 600 after a time period that was sufficient for solenoid 408 to melt all of silicon 404, resulting in all of tantalum 406 sinking to the bottom of vessel 402 that contains molten silicon 602 thereabove. System 600 includes a precipitating surface 604, which may be a seed crystal, attached to a seed holder 606 that can be raised and lowered, as indicated by arrow 608. For example, seed holder 606 may be configured to immerse precipitating surface 604 in and out of molten silicon 602. Precipitating surface 604 may be configured to collect a precipitate of molten silicon 602, thus growing a silicon crystal that may result in formation of an ingot. One or more computer processors may be configured to execute computer-readable instructions to control operation (e.g., vertical positioning and time spans at such positions) of seed holder 606.

As explained above, the tantalum remains solid throughout the silicon melting process. Thus, the tantalum will not contaminate the molten silicon and therefore the silicon melt, such as molten silicon 602, may have a relatively high purity. To add to this, crystal growth on a precipitating surface (e.g., 604, a seed crystal) may further contribute to high purity. Thus, a silicon ingot formed this way may have an even higher purity.

Figure 7:
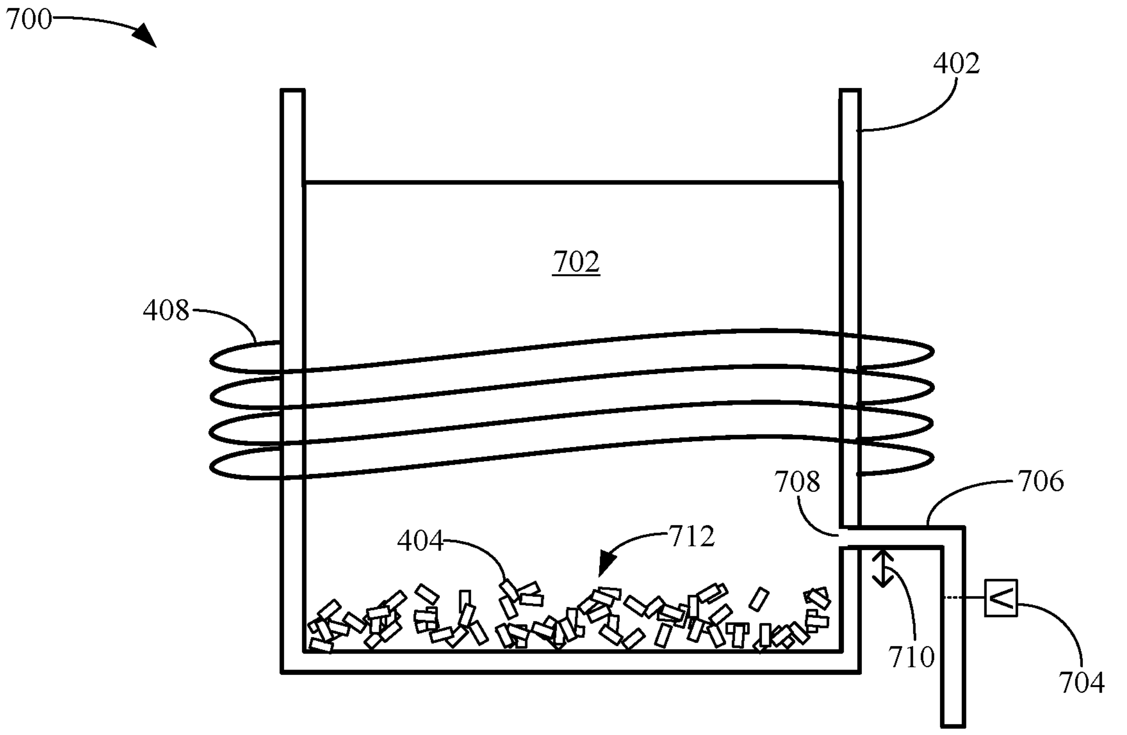
FIG. 7 is a schematic side view of a system for induction melting of silicon and subsequent separation of the melted silicon from solid tantalum, according to some embodiments.

FIG. 7 is a schematic side view of a system 700 for induction melting of silicon and subsequent separation of the melted silicon from solid tantalum, according to some embodiments. Various portions of the system, as illustrated, are not necessarily to scale. System 700 generally comprises electrical and mechanical components that are interfaced with one another in various configurations. System 700 may further comprise one or more computer processors configured to execute computer-readable instructions, which may be directed to controlling at least some of the electrical and mechanical components.

System 700 comprises a configuration that includes a mass of molten silicon 702 that was melted in a system the same as or similar to 100, 200, 300, or 400, for example. In particular, FIG. 7 illustrates system 700 after a time period that was sufficient for solenoid 408 to melt all of silicon 404, resulting in all of tantalum 406 sinking to the bottom of vessel 402 that contains molten silicon 602 thereabove. System 700 includes a valve 704 and conduit 706 for removing molten silicon 702. In some implementations, an exit port 708 may be positioned in the side of vessel 402 at a height 710 above the top of an accumulation 712 of sunken solid tantalum. In other implementations, the exit port may include a screen or have an opening size that prevents entry of the tantalum so that the exit port may be positioned nearer to the bottom of vessel 402. One or more computer processors may be configured to execute computer-readable instructions to control operation of valve 704.

Figure 8:
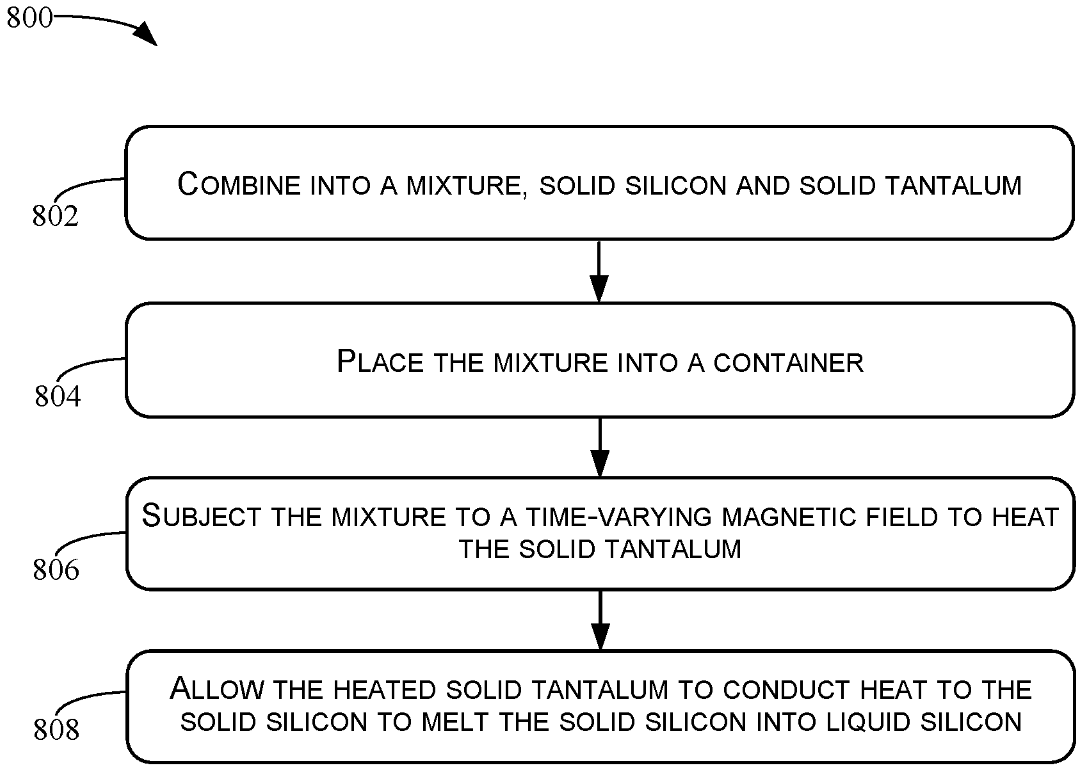
FIG. 8 is a flow diagram of a process of induction melting of silicon using tantalum as a heat-delivery seed, according to some embodiments.

FIG. 8 is a flow diagram of a process 800 of induction melting of silicon using tantalum as a seed, according to some embodiments. Process 800 may be performed by an operator that is human, a computer processor performing executable electronic instructions, or a combination of both, for example.

At 802, the operator may combine solid silicon and solid tantalum as a mixture. For example, solid silicon 104 and solid tantalum 106 may be combined into a homogeneous or non-homogeneous mix that is placed into vessel 102 at 804. In some implementations, solid silicon 104 and solid tantalum 106 may be combined in vessel 102. In this way, a concentration of tantalum may be varied in a controlled way from bottom to top of vessel 102. For example, an amount of tantalum per unit of silicon placed toward the bottom of vessel 102 may be greater than the amount placed higher in the vessel. In other implementations, solid silicon 104 and solid tantalum 106 may be combined outside vessel 102, wherein various mixes may have concentrations of tantalum different from one another. Such mixes may then be added into vessel 102 in a particular sequence so that tantalum concentration varies in a predetermined fashion.

At 806, the operator may subject the mixture to a time-varying magnetic field to heat the solid tantalum via magnetic induction that results in eddy currents in the tantalum. At 808, the operator may allow, by controlling timing of the process, for example, the heated solid tantalum to conduct heat to the solid silicon to melt the solid silicon into liquid silicon. For example, based on a number of parameters, such as solenoid current, tantalum concentration, vessel size, and silicon and tantalum grain size, just to name a few examples, the operator may operate one or more solenoids to inductively heat the tantalum for a time span determined by previous experience (e.g., experimental data) and/or real-time measurements (e.g., temperature(s) of the tantalum-silicon mixture).

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are shown and described in order to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

We claim as follows:

1. A method for melting silicon, the method comprising:
- combining into a mixture, solid silicon and solid tantalum;
- subjecting, in a vessel, the mixture to a time-varying magnetic field to heat the solid tantalum; and
- allowing the heated solid tantalum to conduct heat to the solid silicon to melt the solid silicon into liquid silicon.

2. The method of claim 1, wherein the solid tantalum is cylindrical.

3. The method of claim 1, wherein the mixture is substantially uniform such that the solid tantalum and the solid silicon are homogeneously mixed.

4. The method of claim 1, wherein the mixture is non-uniform such that a concentration of the solid tantalum varies vertically in the vessel.

5. The method of claim 1, further comprising adjusting a spatial distribution of the time-varying magnetic field based, at least in part, on a rate of sinking of the solid tantalum in the liquid silicon.

6. The method of claim 1, further comprising adjusting a magnitude of the time-varying magnetic field based, at least in part, on a rate of sinking of the solid tantalum in the liquid silicon.

7. The method of claim 1, wherein the time-varying magnetic field is produced by a vertically-moveable solenoid, the method further comprising:
- controlling the vertical motion of the solenoid based, at least in part, on a rate of sinking of the solid tantalum in the liquid silicon.

8. The method of claim 1, wherein the time-varying magnetic field is produced by a vertically-moveable solenoid, the method further comprising:
- controlling the vertical motion of the solenoid based, at least in part, on a rate of melting of the solid silicon.

9. The method of claim 1, wherein the time-varying magnetic field is produced by a solenoid that comprises two or more individually operable portions, the method further comprising:
- selectively operating the two or more individually operable portions of the solenoid based, at least in part, on a rate of sinking of the solid tantalum in the liquid silicon.

10. The method of claim 1, wherein the time-varying magnetic field is produced by a solenoid that comprises two or more individually operable portions, the method further comprising:
- selectively operating the two or more individually operable portions of the solenoid based, at least in part, on a rate of melting of the solid silicon.

11. The method of claim 1, further comprising, after the solid tantalum has sunk toward the bottom of the vessel:
- condensing silicon vapor from the liquid silicon onto a surface that is above the vessel.

12. The method of claim 1, further comprising, after the solid tantalum has sunk toward the bottom of the vessel:
- placing a seed crystal into the liquid silicon; and
- growing a silicon crystal from the seed crystal.

13. A system for melting silicon, the system comprising:
- a refractory crucible;
- a mixture of solid silicon and solid tantalum in the refractory crucible; and
- an induction coil to produce a time-varying magnetic field in the mixture to heat the solid tantalum, wherein the heated solid tantalum conducts heat to the solid silicon to melt the solid silicon into liquid silicon.

14. The system of claim 13, wherein the solid tantalum is cylindrical.

15. The system of claim 13, wherein the mixture is substantially uniform such that the solid tantalum and the solid silicon are homogeneously mixed.

16. The system of claim 13, wherein the mixture is non-uniform such that a concentration of the solid tantalum varies vertically in the vessel.

17. The system of claim 13, further comprising a controller to adjust a distribution of the time-varying magnetic field based, at least in part, on a rate of sinking of the solid tantalum in the liquid silicon.

18. The system of claim 13, further comprising a controller to adjust the time-varying magnetic field based, at least in part, on a rate of sinking of the solid tantalum in the liquid silicon.

19. The system of claim 13, wherein the induction coil is vertically moveable, the system further comprising:
- a controller to vertically move the solenoid based, at least in part, on a rate of sinking of the solid tantalum in the liquid silicon.

20. The system of claim 13, wherein the induction coil comprises two or more individually operable portions, the system further comprising:
- a controller to selectively operate the two or more individually operable portions of the solenoid based, at least in part, on a rate of melting of the solid silicon.

* * * * *